(12) United States Patent
Ito et al.

(10) Patent No.: US 6,526,360 B1
(45) Date of Patent: Feb. 25, 2003

(54) POWER CONSUMPTION DISPLAY DEVICE FOR MACHINE

(75) Inventors: Susumu Ito, Hino (JP); Mitsushi Yoshioka, Yamanashi (JP)

(73) Assignee: Fanuc Ltd., Yamanashi (JP)

( * ) Notice: Subject to any disclaimer, the term of this patent is extended or adjusted under 35 U.S.C. 154(b) by 0 days.

(21) Appl. No.: 09/472,063

(22) Filed: Dec. 23, 1999

(30) Foreign Application Priority Data

Jan. 11, 1999 (JP) .......................................... 11-003571

(51) Int. Cl.⁷ ............................................. G05B 23/02
(52) U.S. Cl. ............................. 702/60; 702/62; 714/724
(58) Field of Search ..................... 702/60, 62; 700/175; 73/862.06; 318/650, 142; 714/724; 716/8; 703/18

(56) References Cited

U.S. PATENT DOCUMENTS

| | | | |
|---|---|---|---|
| 4,839,819 A | | 6/1989 | Begin et al. |
| 4,916,389 A | * | 4/1990 | Hori et al. .................. 323/269 |
| 5,196,982 A | * | 3/1993 | Landsberg et al. ............ 361/78 |
| 5,350,640 A | * | 9/1994 | Masui ........................ 429/61 |
| 5,555,725 A | * | 9/1996 | Shimasaki et al. .......... 219/202 |
| 5,587,931 A | * | 12/1996 | Jones et al. ................... 702/34 |
| 5,792,483 A | | 8/1998 | Siegrist et al. |
| 5,911,924 A | | 6/1999 | Siegrist et al. |

FOREIGN PATENT DOCUMENTS

| | | | |
|---|---|---|---|
| DE | 43 45 034 A1 | 10/1994 | ........... B29C/45/77 |
| EP | 0 487 817 A2 | 6/1992 | ........... B29C/45/76 |
| EP | 0 621 676 A1 | 10/1994 | ........... H02J/13/00 |
| JP | 7-32430 | 2/1995 | |
| JP | 10-227813 | 8/1998 | |
| JP | 10-240360 | 9/1998 | |
| JP | 10-336893 | 12/1998 | |

* cited by examiner

Primary Examiner—Kamini Shah
(74) Attorney, Agent, or Firm—Staas & Halsey LLP

(57) ABSTRACT

The present invention provides a display device displaying power consumption of a machine, which can display power consumption of each power consuming element of the machine and power consumption per cycle of manufacture of products. The display device displays average power consumption of each of power consuming elements M1, M3, M4, M2, M6 and M5 and the total sum of the average power consumption graphically in the manner of displaying the average power consumption of the power consuming elements M1, M3, M4, M2, M6 and M5 in piles every predetermined time period. The power consumption display device also displays power consumption Whc per cycle of manufacture of products or the like through repetitive operation.

10 Claims, 13 Drawing Sheets

POWER CONSUMPTION DISPLAY DEVICE FOR MACHINE

BACKGROUND OF THE INVENTION

1. Field of the Invention

This invention relates to a power consumption display device which enables display of power consumption of each power consuming element of a machine and power consumption per cycle of manufacture of products.

2. Description of the Prior Art

In Japanese Patent Application Laid-open No. 7-32430, there is disclosed a controller usable as a power consumption display device for a machine. However, since this controller is merely effective in finding and displaying only power consumption or average power consumption of a screw rotating motor of an injection molding machine every molding cycle, and makes it impossible to monitor the power consumption state concerned with other motors, servo motors and band heaters or like power consuming elements or the overall power consumption state of the whole of the machine, it is difficult to derive information required for attainment of effective power utilization and information required for calculation of product cost.

OBJECTS AND SUMMARY OF THE INVENTION

It is an object of the present invention to provide a machine power consumption display device which may display effectively information required for attainment of effective power utilization information required for calculation of machined product cost and so on.

Particularly, the present invention aims at providing a device for finding and displaying power consumption per cycle of a machine, which is effective in manufacturing products or carrying out predetermined work by repeating the same operation cyclically.

To attain the above object, a power consumption display device according to the present invention is configured to permit power consumption of each power consuming element or the total sum of power consumption of power consuming elements to be displayed, printed, stored in, a storage medium or outputted to a communication line every machine operation process or every predetermined time period.

Display of power consumption of each power consuming element for every machine operation process makes the weight of power consumption between the power consuming elements clear to attain information required for effective power utilization. Further, the display of power consumption of each power consuming element or that of the total sum of power consumption for every predetermined time period makes the transition of power consumption in terms of time clear to easily ascertain the influence of machine operating conditions upon the power consumption of the power consuming elements or easily detect a period of time suitable for machine operation.

The predetermined time period can be units of hours, units of days or units of the time longer than a day.

Further, the power consumption display device is effective in displaying an integrated value of power consumption of the power consuming elements in a predetermined period of time or the total sum of integrated values of power consumption of the power consuming elements in a predetermined period of time.

The integrated value of power consumption or the total sum of integrated values of power consumption may be counted by the unit of hour, day or any time longer than a day.

Further, the integrated value of power consumption or the total sum of integrated values of power consumption may be displayed for every machine operation process.

The power consumption may be displayed by numeric or graphic representation or by both numeric and graphic representations. Further, display of power consumption in time series makes the transition of power consumption in terms of time for each power consuming element and that of overall power consumption of the power consuming elements more clear.

The power consumption is measured by a power measuring unit of each power consuming element or is calculated by detecting drive current of an amplifier for driving each power consuming element.

According to the present invention, since the power consumption display device may display the power consumption of each power consuming element concerned with drive or control of a machine for every predetermined time period, it is possible to easily recognize the presence or absence of abnormality of each individual power consuming element, the balance of overall power consumption concerned with the power consuming elements and so on. Further, in the case of making alterations on the machine operating conditions, it is possible to easily observe how the alterations exert an influence upon the power consumption of the power consuming elements.

In case of an electromotive injection molding machine, an electric discharge machine, a press machine, machine tools, an industrial robot or like machine which is effective in manufacturing the same products or carrying out the same work by repeating the same operation, since the transition of power consumption of the machine per cycle of repetitive operation or that of power consumption of each power consuming element is displayed in time series, it is possible to calculate power rates per machined product and also per cycle of repetitive operation. It is also possible to make the time-series transition of power consumption of each power consuming element or that of overall power consumption of the power consuming elements dear to thereby easily find a period of time suitable for machine operation.

BRIEF DESCRIPTION OF THE DRAWINGS

The foregoing and other objects and features of the invention will become apparent from the following description of preferred embodiments of the invention with reference to the accompanying drawings, in which.

DETAILED DESCRIPTION OF THE PREFERRED EMBODIMENTS

Figure 1:
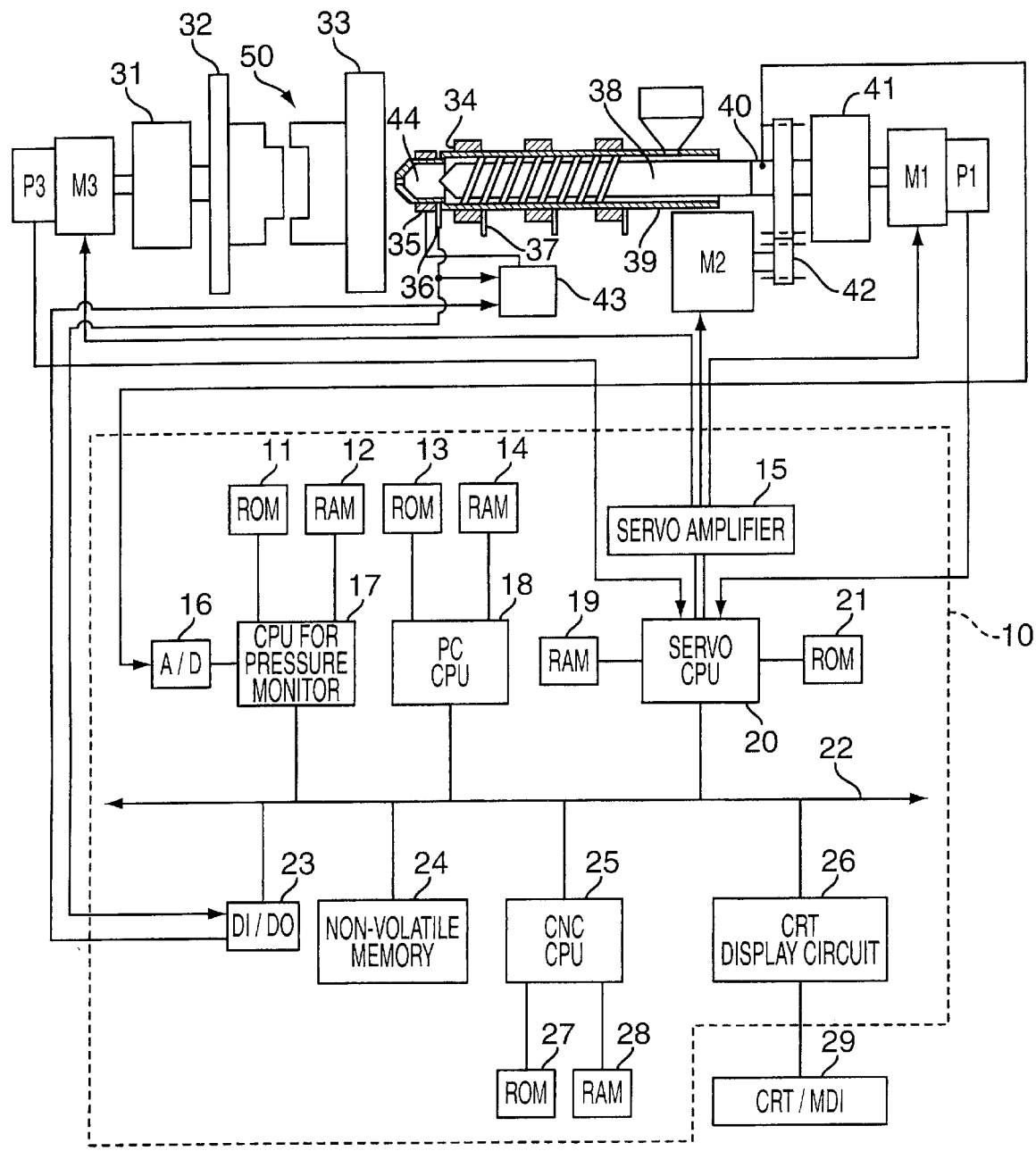
FIG. 1 is a block diagram showing the essential configuration of an electromotive injection molding machine and a controller thereof according to an embodiment, to which a power consumption display device of the present invention is applied.

FIG. 1 is a block diagram showing the essential configuration of an electromotive injection molding machine and a controller thereof according to an embodiment, to which the present invention is applied.

In FIG. 1, reference numeral 33 denotes a fixed platen, 32 is a movable platen, 39 is an injection cylinder, and 38 is a screw. The injection cylinder 39 is mounted with a band heater 34 and a thermocouple 37 serving as a temperature detecting means.

A plurality of sets of band heaters 34 and thermocouples 37 are provided in a longitudinal direction so, for control temperature of parts of the injection cylinder 39 individually, and a nozzle 44 at the end of the injection cylinder 39 is also mounted with a band heater 35 and a thermocouple 36 similarly to the above.

Although there is shown only a temperature adjuster 43 for PID (proportion, integration and differentiation) feedback control of the temperature of the band heater 35 on the nozzle 44 in FIG. 1, a similar temperature adjuster 43 is also individually installed to the band heaters 34 and the thermocouples 37 at the parts of the injection cylinder 39 and a bar heater and a thermocouple mounted on a mold 50.

The movable platen 32 is moved along a tie bar (not shown) through a drive converting device 31 composed of ball nut & screw and a toggle mechanism or the like in response to shaft output of a clamping servo motor M3.

The screw 38 is moved in an axial direction by a drive converting device 41 composed of ball nut & screw and boss & serration or the like and an injection servo motor M1 and is also rotated by a drive mechanism composed of a gear mechanism 42 and a screw rotating servo motor M2 for measuring and kneading independently of the movement in the axial direction.

A controller 10 also serving for a power consumption display device comprises a CPU 25 for CNC which is a microprocessor for numerical control a CPU 18 for PC which is a microprocessor for programmable controller (PC), a servo CPU 20 which is a microprocessor for servo control (This servo CPU is provided according to the number of servo motors to be controlled. For instance, an individual servo CPU is assigned to two servo motors for control although there is shown only one of servo CPUs in the drawing) and a CPU 17 for pressure monitor for sampling of injection holding pressure and screw back pressure. This controller is configured to enable transmission of information between the microprocessors through selection of relative input/output via a bus 22.

To the CPU 18 for PC are connected a ROM 13 stored with a sequence program or the like to control sequence operation of the injection molding machine and a RAM 14 used for temporary storage of operation data and so on. To the CPU 25 for CNC are connected a ROM 27 stored with a program or the like to control the injection molding machine wholly and a RAM 28 used for temporary storage of operation data and so on.

To the servo CPU 20 are connected a ROM 21 stored with a control program dedicated to servo control and a RAM 19 used for temporary storage of data, and to the CPU 17 for pressure monitor are connected a ROM 11 stored with a control program concerned with the processing for molding data sampling and so on and a RAM 12 used for temporary storage of data.

To the servo CPU 20 is also connected a servo amplifier 15 (This servo amplifier 15 is provided for every servo motor, although there is shown only one of servo amplifiers in the drawing) to drive axial servo motors such as the injection servo motor M1, the clamping servo motor M3, the ejector servo motor M4 (not shown) and the screw rotating servo motor M2. A feedback signal from a pulse coder P3 installed to the clamping servo motor M3 and that from a pulse coder P1 installed to the injection servo motor M1 or like pulse coder are fed back to the servo CPU 20. Further, a current position of the movable platen 32 is calculated by the servo CPU 20 on the basis of the feedback pulse from the pulse coder P3, while a current position and a current velocity or the like of the screw 38 are calculated by the servo CPU 20 on the basis of the feedback pulse from the pulse coder P1, and these calculated current position and current velocity are stored in a current position storage register and a current velocity storage register of the RAM 19.

Incidentally, since a nozzle touch motor M5 (not shown) and a die height adjusting motor M6 are subjected to velocity control in an open loop, there is no need for pulse coder.

The CPU 17 for pressure monitor is to sample injection holding pressure and screw back pressure through a pressure detector 40 mounted on the stem of the screw 38 and an A/D converter 16.

A non-volatile memory 24 is a molding data storage memory for storing molding conditions, various set values and macro variables or the like concerned with injection molding operation in the manner similar to the prior art.

A manual data input device 29 with display is connected to the bus 22 through a CRT display circuit 26 and is configured to realize display of various set screens and data input operation or the like with function keys, numeric keys and cursor move keys or the like.

While the CPU 18 for PC carries out sequence controls for each axis of the injection molding machine, the CPU 25 for CNC distributes pulse to axial servo motors on the basis of the control program in the ROM 27, and the servo CPU 20 performs the so-called digital servo processing through servo control which includes current loop control, position loop control and velocity loop control in the manner similar to the prior art, on the basis of a move command distributed to each axis in the form of pulse and both a position feedback signal and a velocity feedback signal detected by the pulse coders P1, P3 or like detectors.

Control of temperature of the nozzle 44 and each part of the injection cylinder 39 is realized by the band heaters 35, 34 in the manner similar to the prior art by causing the temperature adjuster 43 to perform PID feedback control on the basis of the relation between the actual temperature fed back as the actual temperature of the nozzle 44 and each part of the injection cylinder 39 by their thermocouples 36, 37 and the objective temperature set in the non-volatile memory 24 for every temperature adjuster 43 by the CPU 18 for PC through an input/output circuit 23. Further, the actual temperature of the nozzle 44 and each part of the injection cylinder 39 detected by their thermocouples 36, 37 is permitted to be supplied into the CPU 18 for PC through the input/output circuit 23. The same manner may be applied to temperature control on the mold 50 by the bar heater and the thermocouple.

In the above configuration, the power consuming element in the electromotive injection molding machine involves four sets of servo motors which include a set of an injection servo motor M1, a set of a clamping servo motor M3, a set of an ejector servo motor M4 and a set of a screw rotating servo motor M2, and two sets of motors which include a set of nozzle touch motor M5 and a set of die height adjusting motor M6, and further a plurality of band heaters 34 for the injection cylinder 39, the band heater 35 for the nozzle 44 and the bar heater for the mold 50.

Incidentally, the controller 10 itself and the manual data input device 29 with display or the like may be regarded as one of the power consuming elements. However, power consumption of those devices and variations in power consumption caused by a change of machine status are smaller than the servo motors, the motors and the heaters, and therefore, such devices are not particularly considered to be power consuming elements in the present embodiment.

A description will now be given of the outline of the processing to calculate power consumption for one cycle of injection molding operation without installing any special power measuring unit to the servo motors, the motors and the heaters or the like which constitutes a power consuming element. It should be noted that the power consumption to be calculated corresponds to one molding operation, wherein in case of forming n pieces of molded products through one molding operation, power consumption per molded product comes to 1/n of the above power consumption.

When a power consuming element is servo motor, electric power W consumed by each servo motor in one molding cycle is expressed as follows, on the assumption that SR represents winding resistance of the servo motor, I represents the value of average drive current fed back from the servo motor during one molding cycle, and T represents current supply time.

$$W = I^2 \cdot SR \cdot T$$

Since detection of a value of drive current fed back from a servo motor is practiced every predetermined sampling period, a value of electric power W consumed by the servo motor during one molding cycle is given by the following expression (1) on the assumption that τ represents a predetermined sampling period, Ix represents a value of instantaneous drive current detected at the predetermined sampling period, and n times of sampling processing are performed during one molding cycle.

$$W = I^2 \cdot SR \cdot T = \sum_{x=1}^{n}(Ix^2 \cdot SR \cdot \tau) = SR \cdot \tau \cdot \sum_{x=1}^{n} Ix^2 \qquad (1)$$

Thus, average power consumption Q consumed by one servo motor throughout one molding cycle is given by a value resulting from dividing the electric power W consumed by a servo motor during one molding cycle by a cycle time Tc of the molding cycle, that is, by the following expression (2).

$$Q = W/Tc \qquad (2)$$

Figure 2:
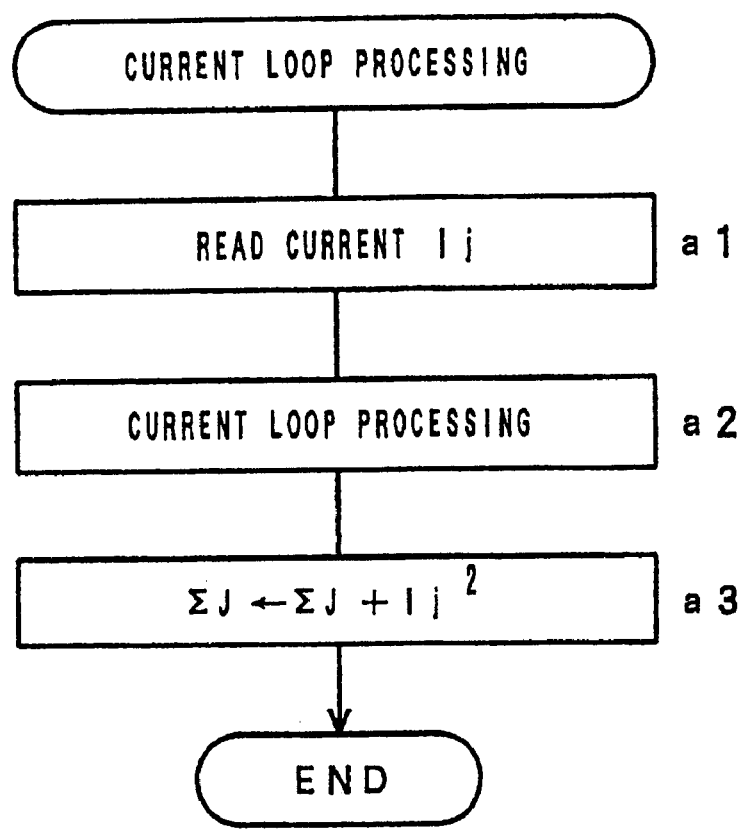
FIG. 2 is a flow chart showing the outline of the processing for current detection by a servo CPU.

In this connection, according to the present embodiment, the servo CPU 20 is caused to perform the processing for current detection together with the current loop processing as shown in FIG. 2 every period τ of the current loop processing throughout one molding cycle so, for calculate a value corresponding to an integrated value (which will be hereinafter referred to as a current square integrated value) of $Ix^2$ in the above expression (1) every servo motor.

Every period of the current loop processing of each servo motor, the servo CPU 20 reads a motor instantaneous drive current $I_j$ (j corresponds to the number of servo motors, and in this case, the total number n1 of the servo motors is 4 (n1=4), so that j=1 to 4) from the servo amplifier 15 (Step a1) and drives the servo motors through the current loop processing on the basis of the current command obtained by the velocity loop processing in the manner similar to the prior art and the read drive current $I_j$ (Step a2).

Since a value of the register $\Sigma_j$ corresponding to each servo motor is initialized to zero at the start of one molding cycle, and the processing for current detection as shown in FIG. 2 is repeated every predetermined period τ throughout one molding cycle, multiplying a value of each register $\Sigma_j$ (wherein j=1 to n1) by the sampling period τ of the instantaneous drive current $I_j$ and the winding resistance $SR_j$ of each servo motor (wherein j=1 to n1) on completing one molding cycle consequently gives electric power $WS_j$ consumed by each servo motor (wherein j=1 to n1) for one molding cycle.

Further, when the power consuming element is normal motor, output value is constant according to the kind of the motor, and therefore, electric power WM consumed by each motor during one molding cycle is given by the following expression (3) on the assumption that W represents a constant of a motor output value, and Y represents current supply time during one molding cycle.

$$WM = W \cdot T \qquad (3)$$

The same may be applied to the case where the power consuming element is heater. That is, since output value is also constant according to the kind of heater, electric power WH consumed by a heater during one molding cycle is given by the following expression (4) on the assumption that W' represents a constant of a heater output value, and T' represents current supply time during one molding cycle.

$$WH = W' \cdot T' \qquad (4)$$

Figure 3:
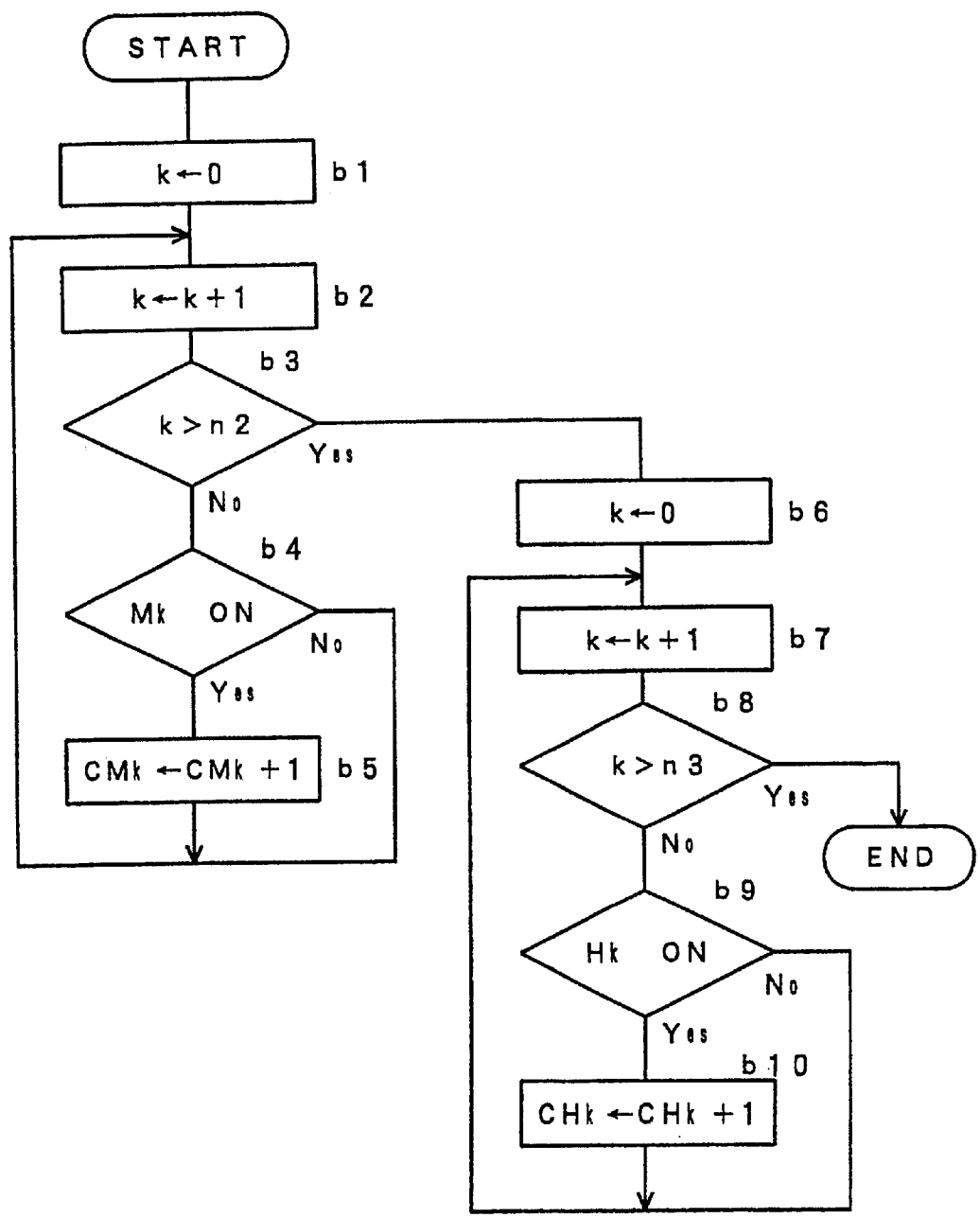
FIG. 3 is a flow chart showing the outline of the processing for current supplying time detection by a CPU for programmable controller (PC)
Figure 4:
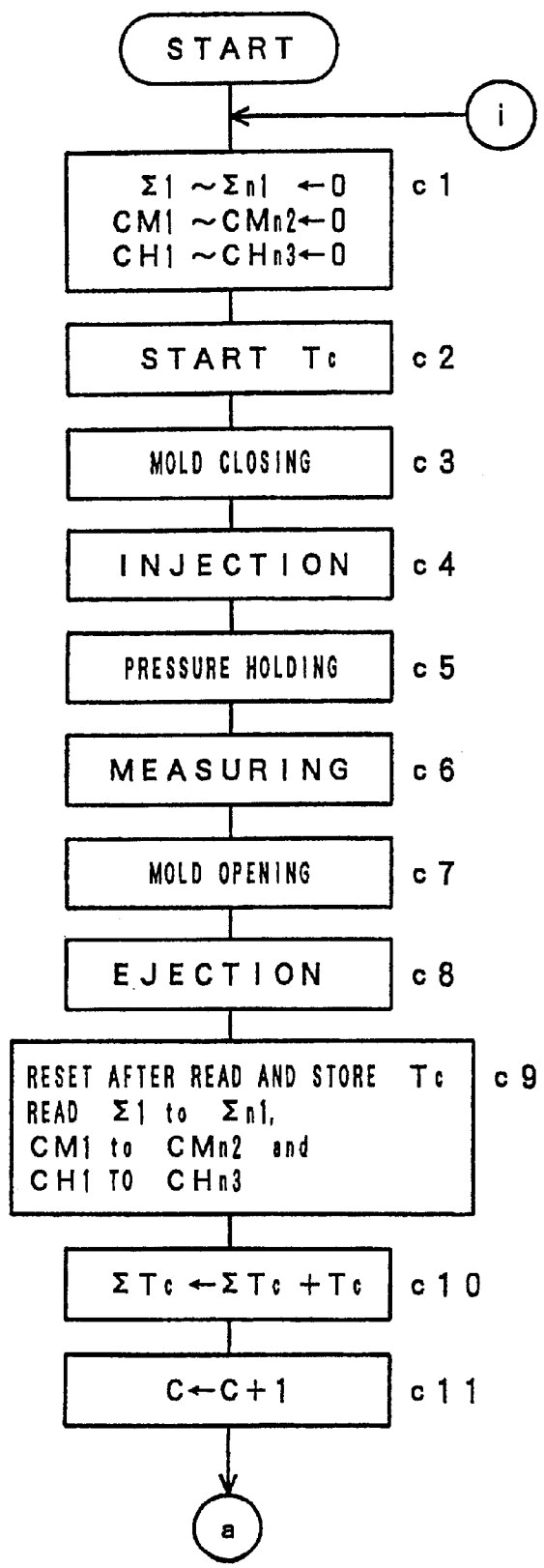
FIG. 4 is a flow chart showing a series of flows concerned with the processing for power consumption display by a CPU for PC and the sequential processing of an injection molding machine.
Figure 5:
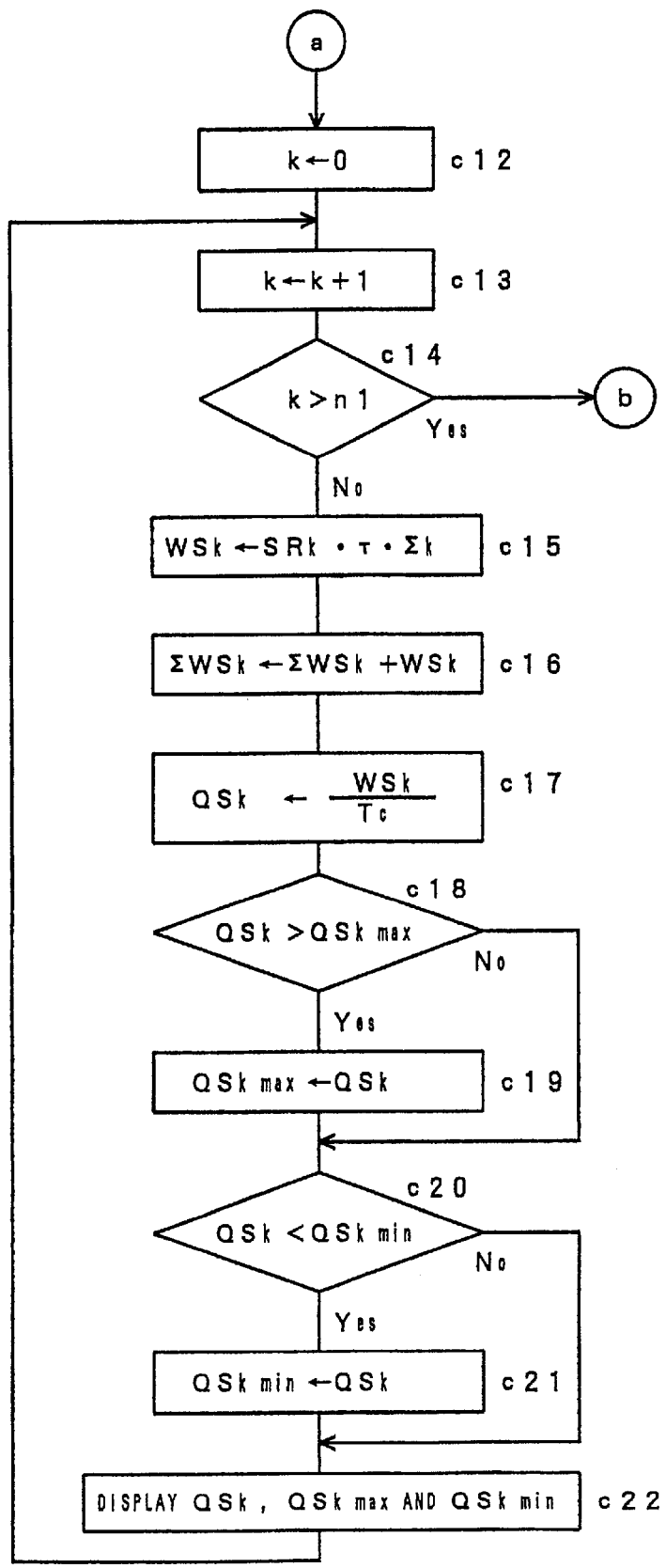
FIG. 5 is a flow chart showing the processing for power consumption display.
Figure 6:
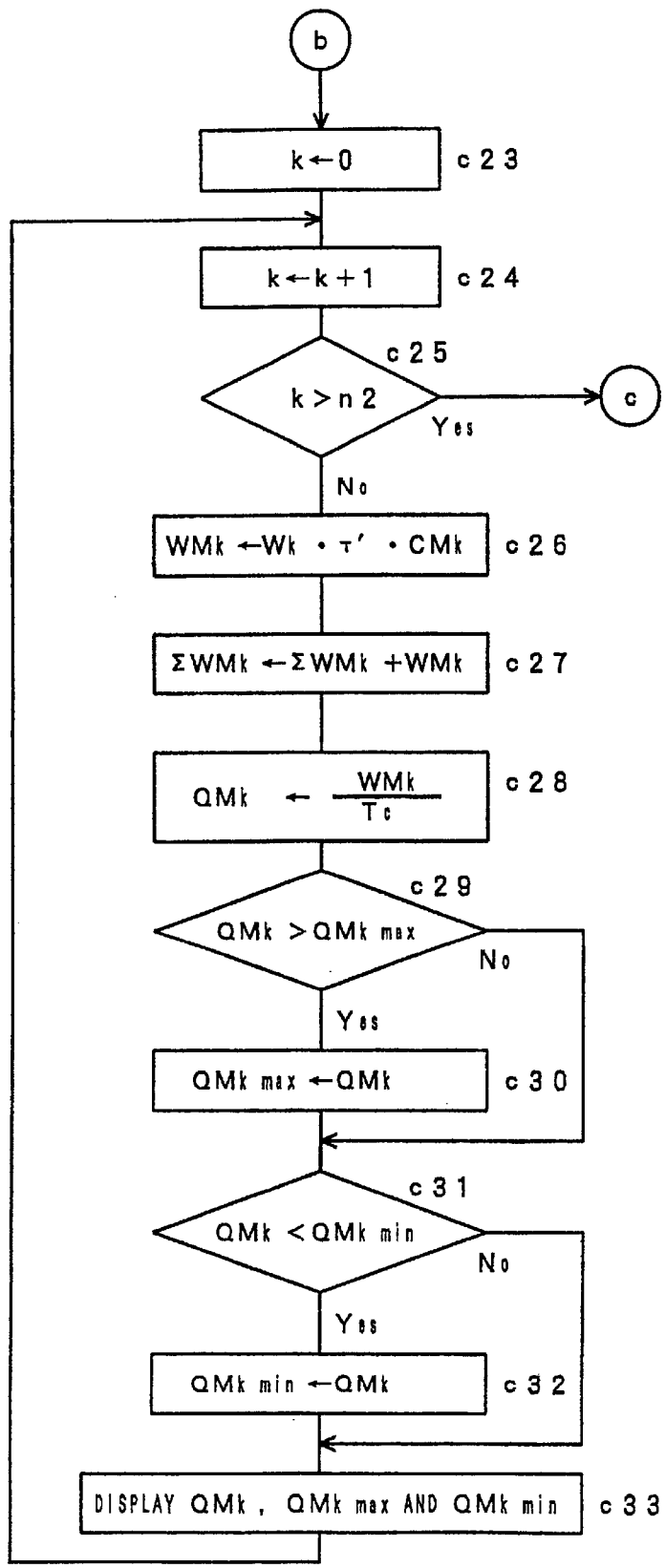
FIGS. 6 to 12 are flow charts continued from that shown in FIG. 5 and also showing the processing for power consumption display, respectively.
Figure 7:
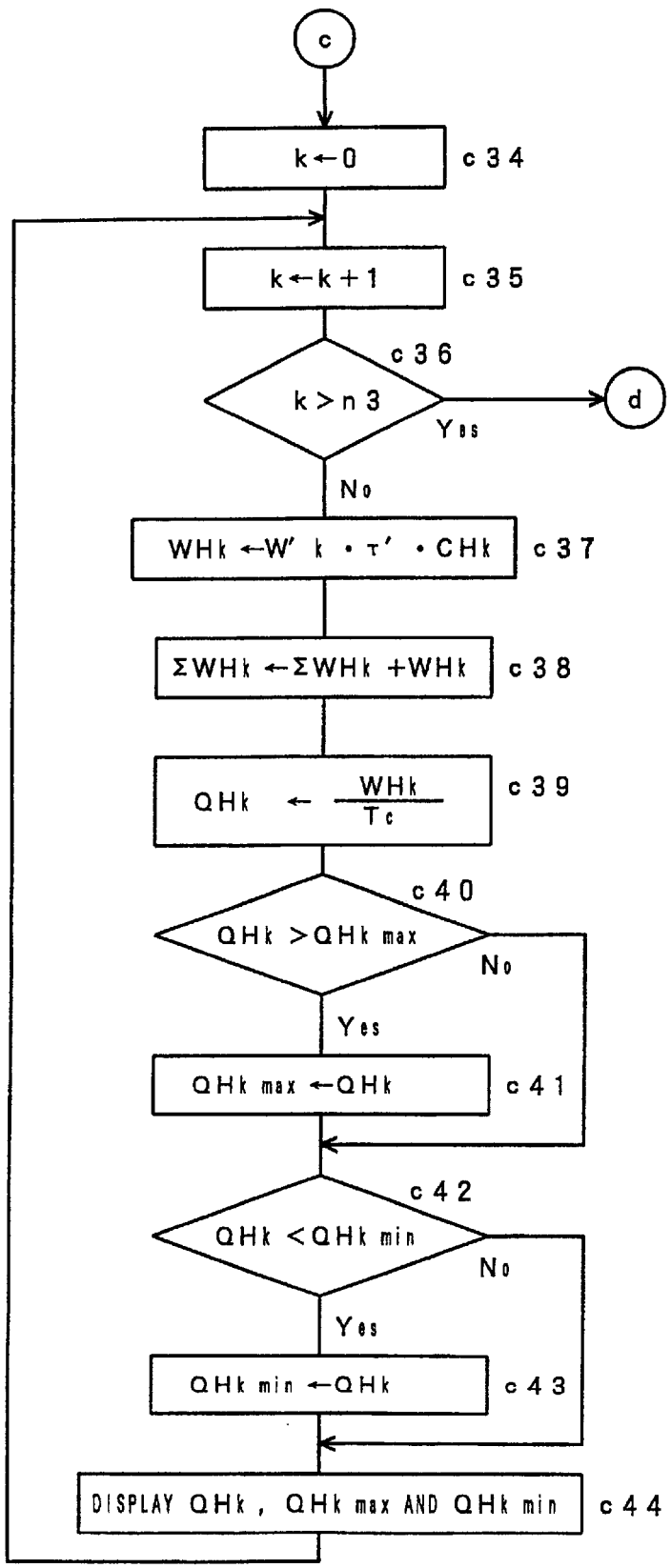
Figure 8:
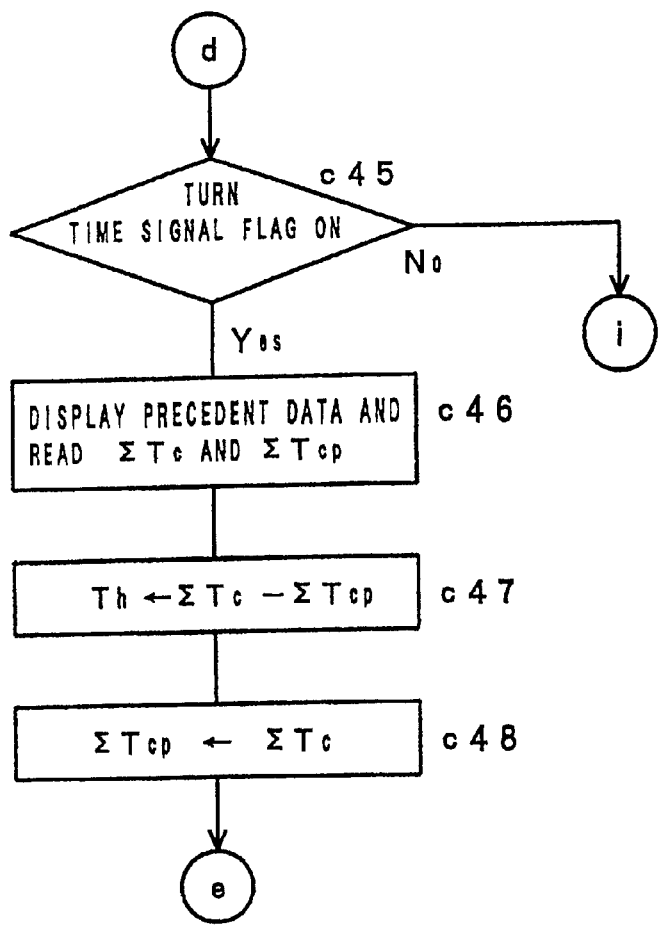
Figure 9:
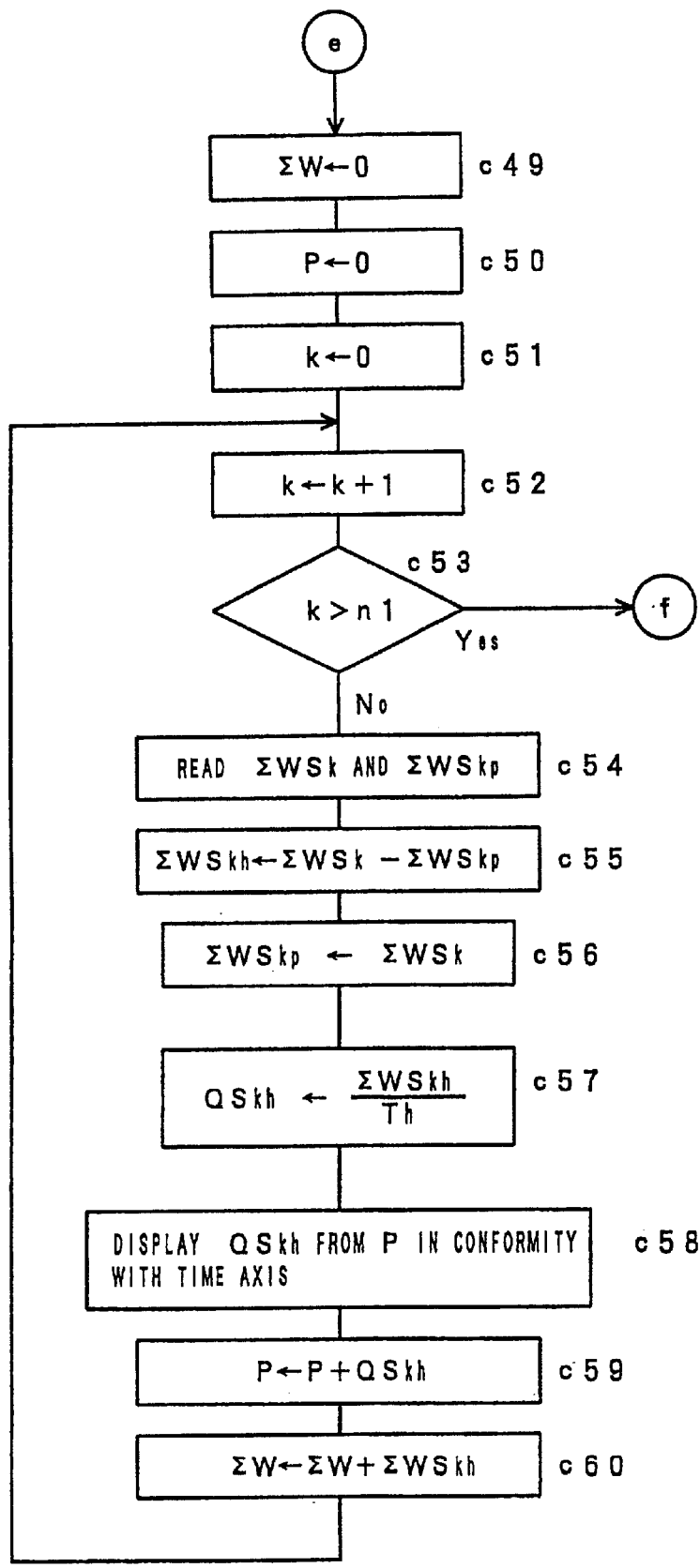
Figure 10:
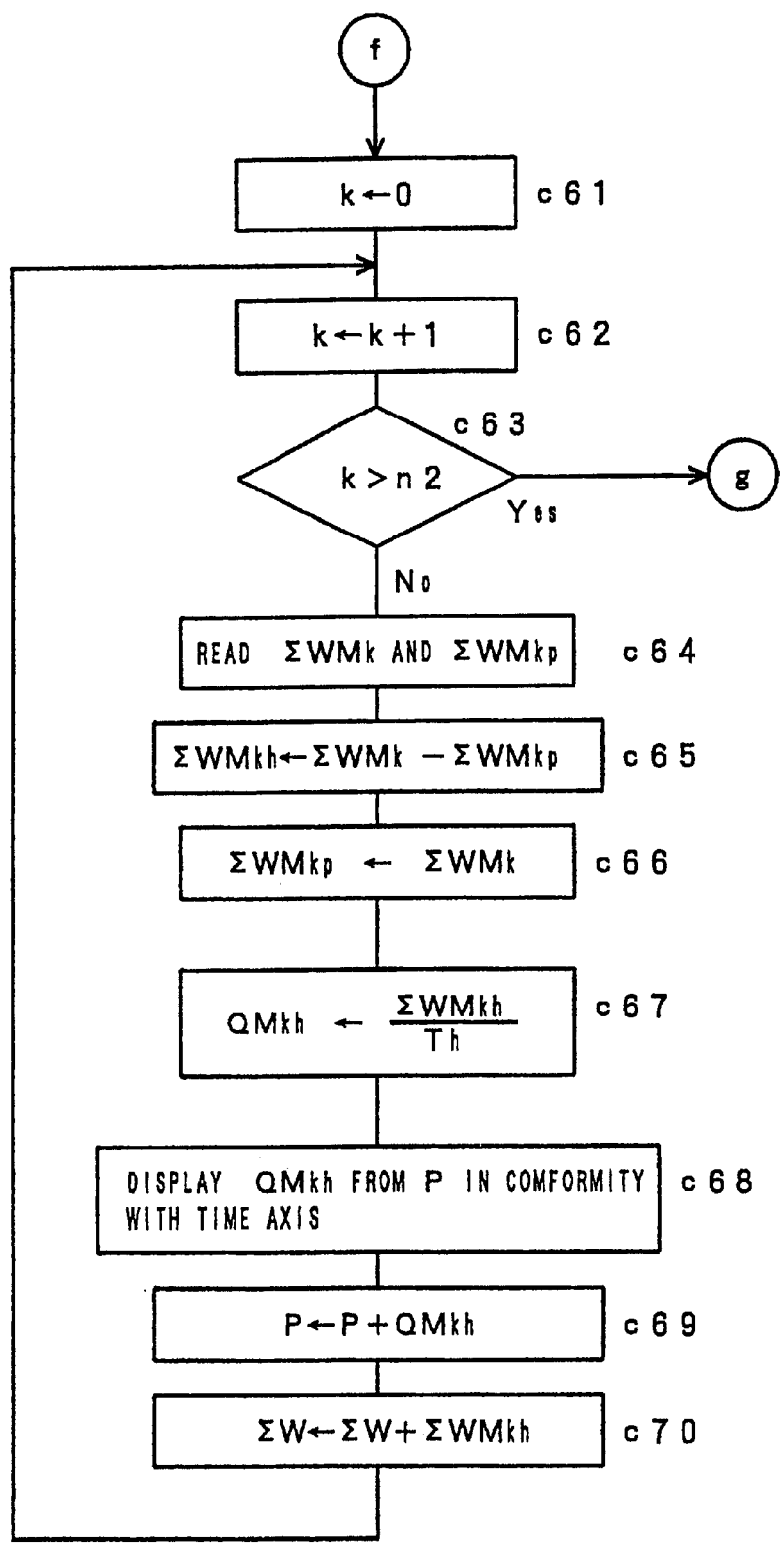
Figure 11:
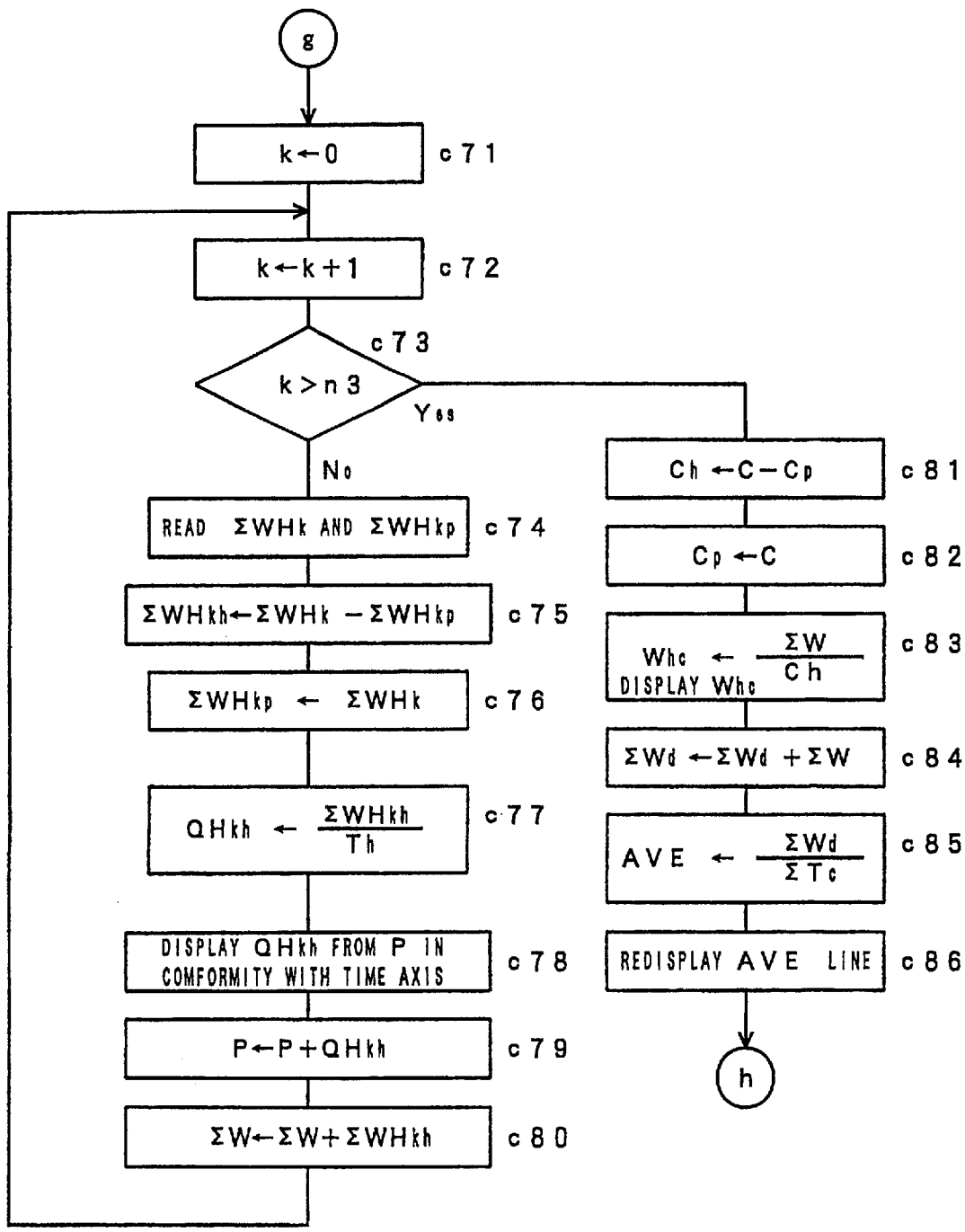
Figure 12:
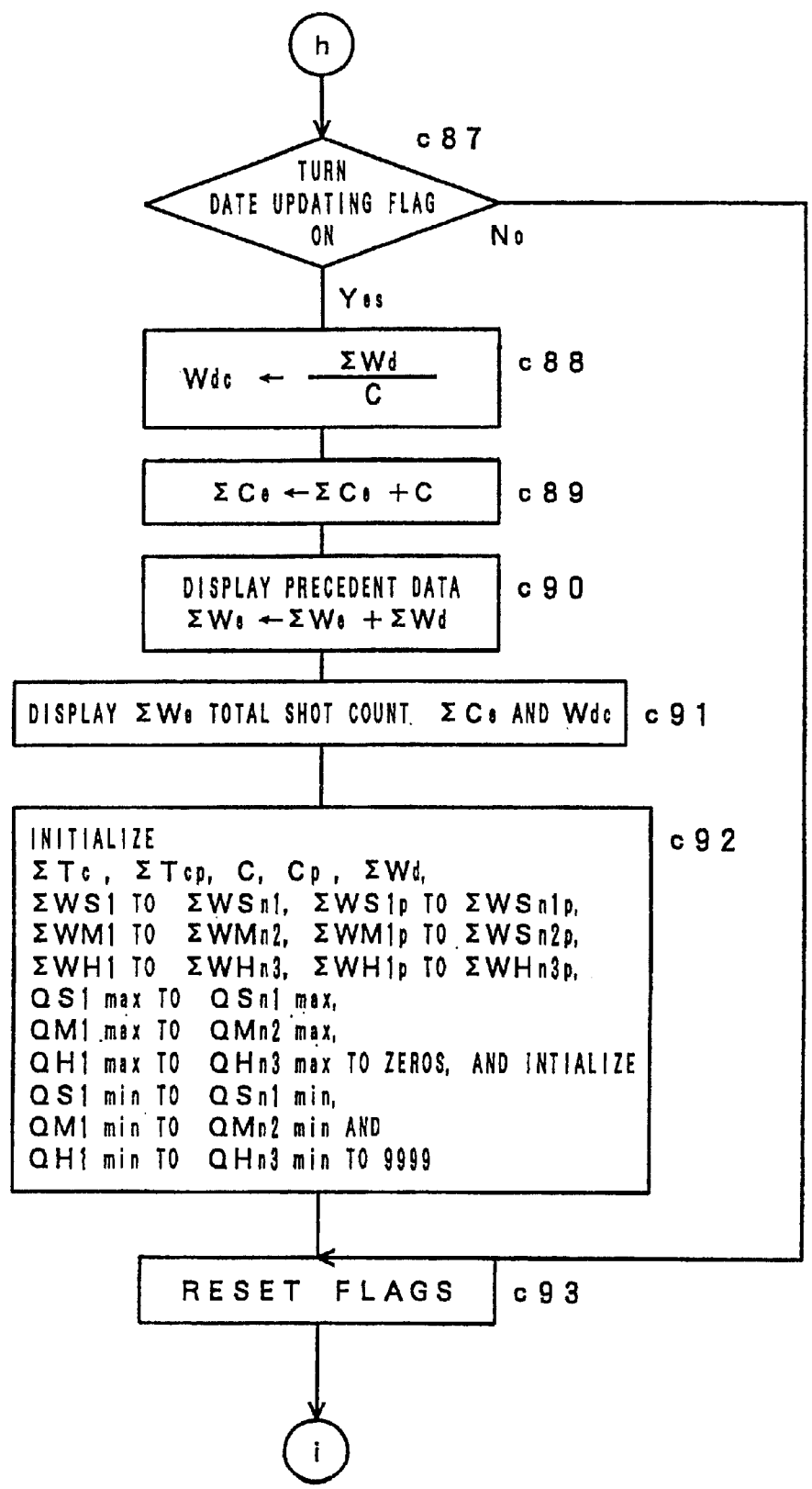

In this connection, according to the embodiment, the CPU 18 for PC is caused to perform the processing for current supplying time detection as shown in FIG. 3 every predetermined sampling period τ' throughout one molding cycle so as to calculate a value corresponding to the current supplying time T, T' of one molding cycle for each motor or heater.

On starting the processing for current-supplying time detection, the CPU 18 for PC first initializes a motor-specifying index k to zero (Step b1), increments a value of the index k by 1 (Step b2) and decides whether or not the value of the index k exceeds total number n2 of the motors (Step b3).

In case of the above embodiment, since two motors are provided in total, a value of n2 is set to 2, and the die height adjusting motor M6 is called by the index k of 1 (K=1), while the nozzle touch motor M5 is called by the index k of 2 (K=2).

When the value of the index k does not exceed the total number n2 of motors, the CPU 18 for PC decides whether or not current is supplied to the motor corresponding to a current value of the index k (Step b4) and increments a value of a counter CMk corresponding to the current value of the index k by 1, provided that current is being supplied (Step b5).

Until the value of the index k reaches the total number n2 of motors, the CPU 18 for PC repeats the processing in Steps b2 to b5 in the manner similar to the above to perform the processing for each motor.

Since a value of each counter CMk (wherein k=1 to n2) is initialized to zero at the start of one molding cycle, and the processing for current supplying time detection as shown in FIG. 3 is repeated every sampling period $\tau'$ throughout one molding cycle, multiplying the value of each counter CMk (wherein k=1 to n2) by the sampling period $\tau'$ on completing the individual molding cycle may consequently give current supply time of one molding cycle for each motor corresponding to index k (k=1 to n2), and further, multiplying the given value of current supply time by a constant Wk inherent in each motor gives electric power WMk consumed by each motor corresponding to index k (k=1 to n2) for one molding cycle.

When the decision in Step b3 results in true, and it is thus ascertained that the processing for current supplying time detection concerned with the motors is terminated, the CPU 18 for PC initializes a heater-specifying index k to zero again (Step b6), then increments a value of the index k by 1 (Step b7) and decides whether or not the value of the index k exceeds the total number n3 of heaters (Step b8).

When the value of the index k does not exceed the total number n3 of heaters, the CPU 18 for PC decides whether or not current is supplied to the heater corresponding to a current value of the index k (Step b9) and increments a value of a counter CHk corresponding to the current value of the index k by 1, provided that current is being supplied (Step b10).

Until the value of the index k reaches the total number n3 of heaters, the CPU 18 for PC repeats the processing at Steps b7 to b10 in the manner similar to the above to perform the processing for each heater.

Since the value of each counter CHk (wherein k=1 to n3) is initialized to zero at the start of one molding cycle, and the processing for current supplying time detection as shown in FIG. 3 is repeated every sampling period $\tau'$ throughout one molding cycle, multiplying the value of each counter CHk (wherein k=1 to n3) by the sampling period $\tau'$ on completing the individual molding cycle may consequently give current supply time of one molding cycle for each heater corresponding to index k (k=1 to n3), and further, multiplying the given value of current supply time by a constant W'k inherent in each heater gives electric power WHk consumed by each heater corresponding to index k (k=1 to n3) for one molding cycle.

FIGS. 4 to 12 are flow charts showing a series of flows concerned with the processing for power consumption display by the CPU 18 for PC and the sequential processing of the injection molding machine, respectively.

Figure 13:
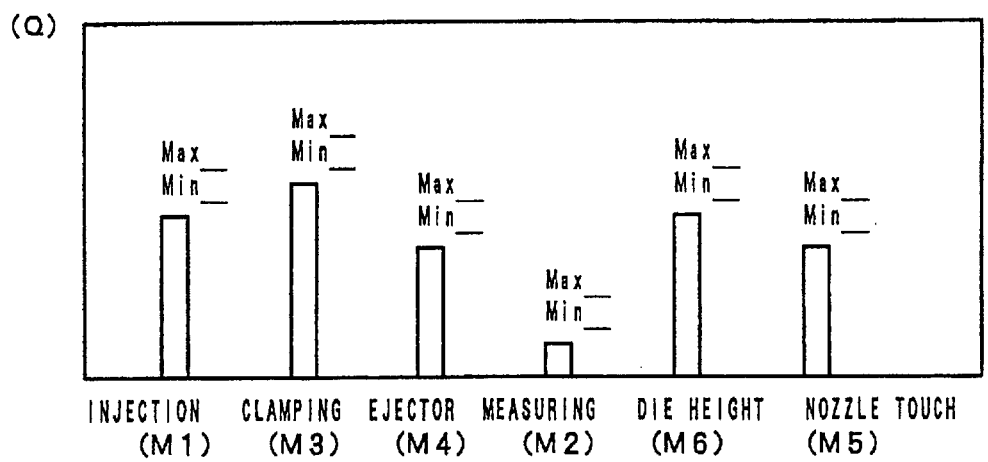
FIG. 13 is a schematic view showing a display screen, on which power consumption of each power consuming element is displayed for every molding cycle by the processing for power consumption display.
Figure 14:
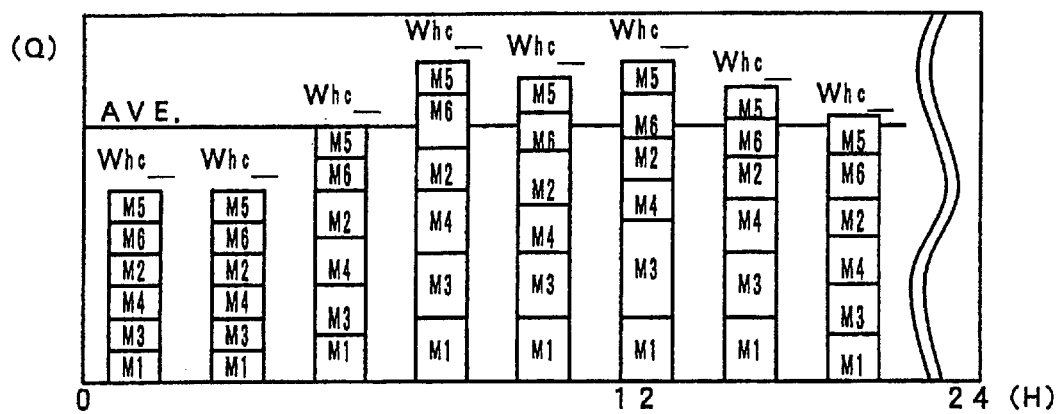
FIG. 14 is a schematic view showing a display screen, on which power consumption of power consuming elements is displayed in total every hour by the processing for power consumption display.
Figure 15:
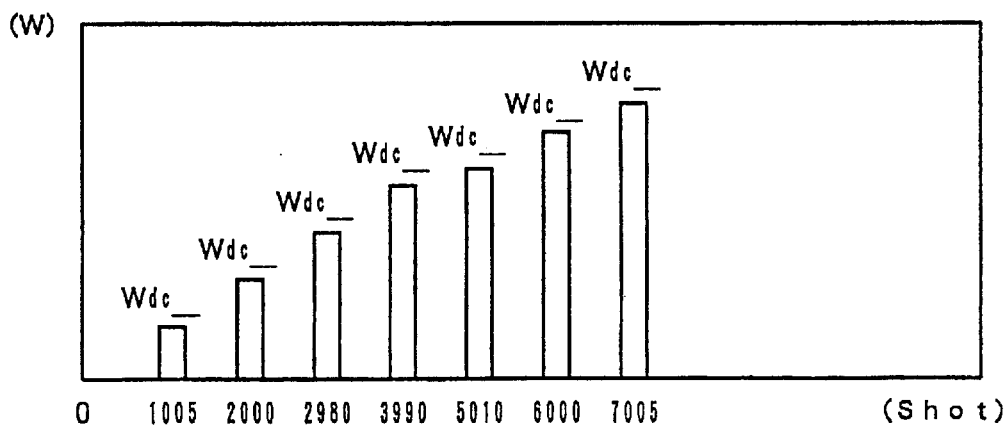
FIG. 15 is a schematic view showing a display screen, on which the total power consumption is displayed in an integrated state every day by the processing for power consumption display.

FIG. 13 is a view showing an example of a display screen, on which the power consumption of each power consuming element is displayed every molding cycle by the processing for power consumption display, FIG. 14 is a view showing a display screen, on which the power consumption of each power consuming element is displayed in total every hour, and FIG. 15 is a view showing a display screen, on which the power consumption of all the power consuming elements is displayed in an integrated state every day.

A description will now be given of the sequential control and the processing for power consumption display by the CPU 18 for PC with reference to FIGS. 4 to 12 in detail.

In advance of the start of injection molding operation of one molding cycle, the CPU 18 for PC first initializes all of the registers $\Sigma 1$ to $\Sigma n1$, the counters CM1 to CMn2 and the counters CH1 to CHn3 to zeros, respectively (Step c1), starts a timer Tc for measuring a time required for one molding cycle (Step c2) and thereafter performs the sequential processing involving mold closing (Step c3), injection (Step c4), pressure holding (Step c5), measuring (Step c6), mold opening (Step c7) and ejection (Step c8), while contacting the CPU 25 for CNC in the manner similar to the prior art.

As described above, since the processing for current detection as shown in FIG. 2 and the processing for current supplying time detection as shown in FIG. 3 are repeated every predetermined period $\tau$, $\tau'$ throughout one molding cycle, a value equivalent to an integrated value of I×2 in the expression (1) is generated in each of the registers $\Sigma 1$ to $\Sigma n1$ corresponding to the servo motors, a value for finding T in the expression (3) is generated in each of the counters CM1 to CMn2, and a value for finding T' in the expression (4) is generated in each of the counters CH1 to CHn3 in the course of the repetition of the above processing.

Upon termination of one molding cycle, the CPU 18 for PC resets the timer Tc after reading and storing a value of the time Tc required for one molding cycle, further reads values stored in the registers $\Sigma 1$ to $\Sigma n1$, the counters CM1 to CMn2 and the counters CH1 to CHn3 (Step c9), stores the time Tc required for the present one molding cycle cumulatively in a total operating time integrating register $\Sigma$Tc for storing a daily operating time of the injection molding machine (Step c10) and increments a value of a daily shot counter C by1 (Step c11).

Incidentally, the initial value of the total operating time integrating register $\Sigma$Tc is zero, and the total operating time integrating register is reset to the initial value in response to 0 A.M. time signal, that is, at the end of a day by the processing in Step c92 which will be described later.

Subsequently, the CPU 18 for PC initializes a servo motor-specifying index k to zero (Step c12), increments a value of the index by 1 (Step c13) and decides whether or not the value of the index k exceeds the total number n1 of servo motors (Step c14).

When the value of the index k does not exceed the total number n1 of servo motors, the CPU 18 for PC reads a current square integrated value $\Sigma k$ from a register $\Sigma k$ corresponding to the servo motor specified by a current value of the index k to find electric power WSk consumed by the specified servo motor during one molding cycle by multiplying the read value by the sampling period $\tau$ of instantaneous drive current and the winding resistance SRk of the specified servo motor (See the expression (1)) (Step c15) and stores the found value of the electric power cumulatively in an integrated power consumption storage register $\Sigma$WSk for integrating the daily total power consumption of the specified servo motor (Step c16).

Subsequently, the CPU 18 for PC finds average power consumption QSk of the servo motor specified by the current value of the index k during one molding cycle by dividing the electric power WSk consumed by the servo motor specified by the current value of the index k during one molding cycle by the time Tc required for the present molding cycle (See the expression (2)), to store the found value of the average power consumption in an average power consumption storage file means in association with the shot count C (Step c17), then decides whether or not the value of the average power consumption QSk is larger than a value of a register QSk(max) (Step c18) and replaces the value of the register QSk(max) with the current value of the average power consumption QSk, provided that the value of the average power consumption QSk is larger than the value of the register QSk(max) (Step c19).

Since the initial value of the register QSk(max) is zero, and the register QSk (max) is reset to the initial value in response to 0 A.M. time signal, that is, at the end of a day by the processing in Step c92 which will be described later, the maximum value of the average power consumption in that day is consequently permitted to be stored in the register QSk(max), for the servo motor specified by the current value of the index k.

Further, the CPU 18 for PC decides whether or not the value of the average power consumption QSk is smaller than a value of a register QSk(min) (Step c20) and replaces the value of the register QSk(min) with a current value of the average power consumption QSk, provided that the value of the average power consumption QSk is smaller than the value of the register QSk(min) (Step c21).

Since the initial value of the register QSk(min) is infinity (or the maximum value possible for storage in the register), and the register QSk(min) is reset to the initial value in response to 0 A.M. time signal, that is, at the end of a day by the processing in Step c86 which will be described later, the minimum value of the average power consumption in that day is consequently permitted to be stored in the register QSk(min), for the servo motor specified by the current value of the index k.

Subsequently, as shown in FIG. 13, the CPU 18 for PC displays the average power consumption QSk of the servo motor specified by the current value of the index k during one molding cycle on the manual data input device 29 with display by bar graphic representation and also displays the maximum value QSk(max) and the minimum value QSk (min) on the manual data input device 29 with display by numeric representation (Step c22).

Until the current value of the index k exceeds the total number n1 of servo motors, the CPU 18 for PC repeats the above processing in Steps c13 to c22 to display the average power consumption QSk during one molding cycle by bar graphic representation and also the maximum value QSk (max) and the minimum value QSk(min) of the average power consumption up to this point of time in that day by numeric representation concurrently on the same screen as shown in FIG. 13, for all the servo motors specified by the index k of 1 to n1, that is, the injection servo motor M1, the clamping servo motor M3, the ejector servo motor M4 and the screw rotating servo motor M2.

When the current value of the index k exceeds the total number n1 of servo motors, and it is thus ascertained by the decision processing in Step c14 that the display processing concerned with each servo motor is terminated, the CPU 18 for PC initializes the index k to zero again for starting the display processing concerned with various motors (Step c23), increments a value of the index k by 1 (Step c24) and decides whether or not the value of the index k exceeds the total number n2 of motors (Step c25).

When the value of the index k does not exceed the total number n2 of motors, the CPU 18 for PC reads a value CMk for finding T in the expression (3) from the counter CMk corresponding to the motor specified by the current value of the index k, finds a value of T in the expression (3) by multiplying the read value by ON/OFF sampling period τ' of the specified motor, further finds electric power WMk consumed by the specified motor during one molding cycle by multiplying the found value of T by a constant Wk relevant to the specified motor (See the expression (3)) (Step c26) and stores the found value of the electric power cumulatively in an integrated power consumption storage register Σ WMk for integrating the daily total power consumption of the specified motor (Step c27).

Subsequently, the CPU 18 for PC finds average power consumption Qk of the motor specified by the current value of the index k during one molding cycle by dividing the electric power WMk consumed by the motor specified by the current value of the index k during one molding cycle by the time Tc required for the present one molding cycle to store the found value of the average power consumption in an average power consumption storage file means in association with the shot count C (Step c28), decides whether or not the value of the average power consumption QMk is larger than a value of a register QMk(max) (Step c29) and replaces the value of the register QMk(max) with the current value of the average power consumption QMk, provided that the value of the average power consumption QMk is larger than the value of the register QMk(max) (Step c30).

Since the initial value of the register QMk(max) is zero, and the register QMk(max) is reset to the initial value in response to 0 A.M. time signal, that is, at the end of a day by the processing in Step c86 which will be described later, the maximum value of the average power consumption in that day is consequently permitted to be stored in the register QMk(max), for the motor specified by the current value of the index k.

Further, the CPU 18 for PC decides whether or not the value of the average power consumption QMk is smaller than a value of a register QMk(min) (Step c31) and replaces the value of the register QMk(min) with the current value of the average power consumption QMk, provided that the average power consumption QMk is smaller than the value of the register QMk(min)(Step c32).

Since the initial value of the register QMk(min) is infinity (or the maximum value possible for storage in the register), and the register QMk(min) is reset to the initial value in response to 0 A.M. time signal that is, at the end of a day by the processing in Step c92 which will be described later, the minimum value of the average power consumption in that day is consequently permitted to be stored in the register QMk(min), for the motor specified by the current value of the index k.

Subsequently, as shown in FIG. 13, the CPU 18 for PC displays the average power consumption QMk of the motor specified by the current value of the index k during one molding cycle on the manual data input device 29 with display by bar graphic representation and also displays the maximum value QMk(max) and the minimum value Q(min) on the manual data input device 29 with display by numeric representation (Step c33).

Until the current value of the index k exceeds the total number n2 of motors, the CPU 18 for PC repeats the above processing in Steps c24 to c33 to display the average power consumption QMk during one molding cycle by bar graphic representation and also the maximum value QMk(max) and the minimum value QMk(min) of the daily average power consumption by numeric representation concurrently on the same screen as shown in FIG. 13, for all the motors specified by the index k of 1 to n2, that is, the screw rotating motor M2 and the nozzle touch motor M5.

When the current value of the index k exceeds the total number n2 of motors, and it is thus ascertained by the decision processing at Step c25 that the display processing concerned with the motors is terminated, the CPU 18 for PC initializes the index k to zero again for starting the display processing concerned with various heaters (Step c34), increments a value of the index k by 1 (Step c35) and decides whether or not the value of the index k exceeds the total number n3 of heaters (Step c36).

When the value of the index k does not exceed the total number n3 of heaters, the CPU 18 for PC reads the value CHk for finding T' in the expression (4) from the counter CMk corresponding to the heater specified by the current value of the index k, finds the value of T' in the expression (4) by multiplying the read value by ON/OFF sampling period τ' of the specified heater, further finds electric power WHk consumed by the specified heater during one molding cycle by multiplying the value of T' by a constant W'k relevant to the specified heater (see the expression (4)) (Step c37) and stores the found value of the electric power cumulatively in an integrated power consumption storage register ΣWHk for integrating the daily total power consumption of the specified heater (Step c38).

Subsequently, the CPU 18 for PC finds average power consumption QHk of the heater specified by the current value of the index k during one molding cycle by dividing the electric power WHk consumed by the heater specified by the current value of the index k during one molding cycle by the time Tc required for the present one molding cycle to store the found value of the average power consumption in an average power consumption storage file means in association with the shot count C (Step c39), then decides whether or not the value of the average power consumption QHk is larger than a value of a register QHk(max) (Step c40) and replaces the value of the register QHk(max) with the current value of the average power consumption QHk, provided that the value of the average power consumption QHk is larger than the value of the register QHk(max) (Step c41).

Since the initial value of the register QHk(max) is zero, and the register Qk(max) is reset to the initial value in response to 0 A.M. time signal that is, at the end of a day by the processing in Step c86 which will be described later, the maximum value of the average power consumption in that day is consequently permitted to be stored in the register QHk(max), for the heater specified by the current value of the index k.

Further, the CPU 18 for PC decides whether or not the value of the average power consumption QHk is smaller than a value of a register QHk(min) (Step c42) and replaces the value of the register QHk(min) with the current value of the average power consumption QHk, provided that the value of the average power consumption is smaller than the value of the register QHk(min) (Step c43).

Since the initial value of the register QHk(min) is infinity (or the maximum value possible for storage in the register), and the register QHk(min) is reset to the initial value in response to 0 A.M. time signal, that is, at the end of a day by the processing in Step c92 which will be described later, the minimum value of the average power consumption in that day is consequently permitted to be stored in the register QHk(min), for the heater specified by the current value of the index k.

Subsequently, the CPU 18 for PC displays the average power consumption QHk of the heater specified by the current value of the index k during one molding cycle on the manual data input device 29 with display by bar graphic representation and also displays the maximum value QHk(max) and the minimum value QHk(min) of the average power consumption on the manual data input device 29 with display by numeric representation (Step c44).

Until the current value of the index k exceeds the total number n3 of heaters, the CPU 18 for PC repeats the above processing in Steps c35 to c44 to display the average power consumption QHk during one molding cycle by bar graphic representation and also the maximum value QHk(max) and the minimum value QHk(min) of the daily average power consumption by numeric representation concurrently on the same screen, for the heaters specified by the index of 1 to n3.

Incidentally, since the form of display by bar graphic and numeric representations in case of the heaters is exactly the same as that in case of the servo motors and the motors described above, displaying concerned with the heaters by graphic and numeric representations is omitted in FIG. 13.

When the current value of the index k exceeds the total number n3 of heaters, and it is thus ascertained by the decision processing in Step c36 that the display processing concerned with the heaters is terminated, transition to the processing in Step c45 is made, or alternatively, the processing to display the average power consumption of the machine by adding the average power consumption values QS1 to QSn1, QM1 to QMn2 and QH1 to QHn3 together may be executed, through this processing is not shown in the drawing. In the processing in Step c45, the CPU 18 for PC decides whether or not a time signal flag is set (Step c45).

The time signal flag is a flag set by a clock device (not shown) installed in the controller 10. The clock device may set the time signal flag in the controller 10 according to operator's demand by outputting a time signal at any desired intervals such as intervals of 30 min., an hour and two hours and is also configured to set a flag representing the updating of date in the controller 10 at 0 A.M.

Incidentally, the date updating flag does not have to be set at 0 A.M. Any other predetermined time in a day is also applicable. Further, the date updating flag may be set once two days or three days or like predetermined point of time.

In the present embodiment, the time signal flag is set at intervals of two hours, and the date updating flag is set once a day at 0 A.M.

When the decision in Step c45 results in false without detecting the time signal flag, the CPU 18 for PC ends the processing concerned with the sequential control for one molding cycle and concurrent displaying of power consumption and returns to the processing in Step c1 to start the processing for the next molding cycle.

In other words, in the absence of the time signal whenever the individual molding cycle for the injection molding machine is terminated, only data relevant to the average power consumption and the maximum and minimum values of each average power consumption of the power consuming elements concerned with the above individual molding cycle such as the servo motors, the motors and the heaters is permitted to be repeatedly displayed in the state as shown in FIG. 13.

Reference to this display screen makes it possible to ascertain not only the presence or absence of abnormality of each individual power consuming element inclusive of overload of the servo motors and the motors and disconnection of the heaters and or the like, but also the overall power consumption balance or the like concerned with each power consuming element. Further, in the case of modifying molding conditions, it is possible to easily observe how the modification exert an influence upon the power consumption of the servo motors and the motors.

Further, comparison between the current value of the average power consumption of each power consuming element and the maximum or minimum value of the average power consumption makes it possible to also estimate the stability of molding operation.

Furthermore, since the value of the average power consumption of each power consuming element is stored in the average power consumption storage file means in association with the shot count C (see Steps c11, c17, c28 and c39), it is possible to reproduce the average power consumption on the manual data input device 29 with display by graphic representation as shown in FIG. 13 in the manner of specifying the shot count C later.

On the other hand, when the decision in Step c45 results in true due to detection of the time signal flag, this decision processing is considered to be the first decision processing since the generation of a time signal, and therefore, the CPU 18 for PC proceeds with the processing of Step c46 and following Steps to start the processing to display the overall power consumption on the display screen as shown in FIG. 14.

When the decision of Step c45 results in true due to detection of the time signal flag, the CPU 18 for PC first, with reference to the file means stored with average power consumption for time intervals for every power consuming element in association with a time-signal point of time, displays average power consumption data for all time intervals, which had been stored in the file means up to a point of precedent detection of time signal on the manual data input device 29 with display, by bar graphic representation in association with the past time-signal point of time as shown in FIG. 14, then reads a current value of the total operating time integrating register ΣTc and a current value of a precedent total operating time integrating register ΣTcp (Step c46), then finds a substantially total operating time Th of the injection molding machine during the time between the precedent detection of time signal and the present detection of time signal by subtracting the value of the precedent total operating time integrating register ΣTcp from the value of the total operating time integrating register ΣTc (Step c47) and replaces the value of the precedent total operating time integrating register ΣTcp with the current value of the total operating time integrating register ΣTc (Step c48).

Incidentally, in some cases, the injection molding machine is temporarily stopped at the time when any one molding cycle is terminated. In that case, since the timer Tc stops time measurement for the duration of the machine stop, the substantially total operating time Th does not agree with the time between the time signals (which will be hereinafter referred to as an interval), for example, two hours, on the whole.

The initial value of the precedent total operating time integrating register ΣTcp is zero as in the case of the total operating time integrating register ΣTc, and the precedent total operating time integrating register ΣTcp is reset to the initial value in response to 0 A.M. time signal that is, at the end of a day by the processing in Step 92 which will be described later.

Subsequently, the CPU 18 for PC initializes a register ΣW for storage of the total power consumption in the interval to zero (Step c49) and further initializes a graph display pointer P to zero (Step c50).

Subsequently, the CPU 18 for PC initializes the servo motor-specifying index k to zero (Step c51), increments a value of the index k by 1 (Step c52) and decides whether or not the value of the index k exceeds the servo motor count n1 (Step c53).

When the value of the index k does not exceed the total number n1 of servo motors, the CPU 18 for PC reads a current value of the integrated power consumption storage register ΣWSk corresponding to the servo motor specified by the current value of the index k and a current value of a precedent integrated power consumption storage register ΣWSKp corresponding to the servo motor specified by the current value of the index k (Step c54), finds substantially electric power ΣWSkh consumed by the servo motor corresponding to the current value of the index k in the interval between the precedent detection of time signal and the present detection of time signal by subtracting the value of the precedent integrated power consumption storage register ΣWSkp from the value of the integrated power consumption storage register ΣWSk (Step c55) and replaces the value of the precedent integrated power consumption storage register ΣWSkp with the current value of the integrated power consumption storage register ΣWSk (Step c56).

Incidentally, the initial value of the precedent integrated power consumption storage register ΣWSkp is zero as in the case of the integrated power consumption storage register ΣWSk, and the precedent integrated power consumption storage register ΣWSkp is reset to the initial value in response to 0 A.M. time signal, that is, at the end of a day by the processing in Step c92 which will be described later.

Subsequently, the CPU 18 for PC finds average power consumption QSkh of the servo motor corresponding to the current value of the index k during the time between the precedent detection of time signal and the present detection of time signal by dividing the value of the substantial electric power ΣWSkh consumed by the corresponding servo motor in during the time between the precedent detection of time signal and the present detection of time signal by the substantially total operating time Th of the injection molding machine during the time between the precedent detection of time signal and the present detection of time signal to store the found value of the average power consumption QSkh in a file means for storage of the average power consumption for an interval for every power consuming element, in association with the time of the presently detected time-signal.(Step c57).

Then, the CPU 18 for PC displays a bar of a length corresponding to the average power consumption QSkh of the servo motor corresponding to the current value of the index k in the predetermined interval in a manner such that the bar lies in conformity with time-signal point of time on a 24-hour time axis (H) of the image screen of the manual data input device 29 with display and the lower end of the bar agrees with the current value of the graph display pointer P on an average power consumption axis (Q) as shown in FIG. 14 (Step c58), stores the value of the average power consumption QSkh cumulatively in the graph pointer P to update a display position of the next bar (Step c59) and further causes the register ΣW for storage of the total power consumption in the interval to cumulatively store the value of the integrated power consumption storage register ΣWSkh for storage of the power consumption in the interval (Step c60).

Until the current value of the index k exceeds the total number n1 of servo motors, the CPU 18 for PC repeats the above processing in Steps c52 to c60 to display the bar of a length corresponding to the average power consumption QSkh of each servo motor in the interval between the precedent detection of time signal and the present detection of time signal so, for pile up the bars with the position of the graph pointer P as a starting point as shown in FIG. 14, for all the servo motors specified by the index k of 1 to n1, that is, the injection servo motor M1, the clamping servo motor M3, the ejector servo motor M4 and the screw rotating servo motor M2.

When the current value of the index k exceeds the total number n1 of servo motors, and it is thus ascertained by the decision processing in Step c53 that the display processing concerned with the servo motors is terminated, the CPU 18 for PC initializes the index k to zero again for starting the display processing concerned with various motors (Step c61), increments a value of the index k by 1 (Step c62) and decides whether or not the value of the index k exceeds the total number n2 of motors (Step c63).

When the value of the index k does not exceed the total number n2 of motors, the CPU 18 for PC reads a current value of the integrated power consumption storage register $\Sigma WMk$ corresponding to the motor specified by the current value of the index k and a current value of a precedent integrated power consumption storage register $\Sigma WMkp$ corresponding to the motor specified by the current value of the index k (Step c64), finds substantially electric power $\Sigma WMkh$ consumed by the motor corresponding to the current value of the index k in the interval between the precedent detection of time signal and the present detection of time signal by subtracting the value of the precedent integrated power consumption storage register $\Sigma WMkp$ from the value of the integrated power consumption storage register $\Sigma WMk$ (Step c65) and replaces the value of the precedent integrated power consumption register $\Sigma WMkp$ with the current value of the integrated power consumption storage register $\Sigma WMk$ (Step c66).

Incidentally, the initial value of the precedent integrated power consumption storage register $\Sigma WMkp$ is zero as in the case of the integrated power consumption storage register $\Sigma WMk$, and the precedent integrated power consumption storage register $\Sigma WMkp$ is reset to the initial value in response to 0 A.M. time signal, that is, at the end of a day by the processing in Step c86 which will be described later.

Subsequently, the CPU 18 for PC finds average power consumption QMkh of the motor corresponding to the current value of the indek k in the interval between the precedent detection of time signal and the present detection of time signal by dividing the value of the substantially electric power $\Sigma WMkh$ consumed by the corresponding motor in the interval between the precedent detection of time signal and the present detection of time signal by the substantially total operating time Th of the injection molding machine in the interval between the precedent detection of time signal and the present detection of time signal to store the found value of the average power consumption QMkh in a file means for storage of the average power consumption in the above interval for every power consuming element, in association with the presently detected time-signal point of time (Step c67).

Then, the CPU 18 for PC displays a bar of a length corresponding to the average power consumption QMkh of the motor corresponding to the current value of the index k in the predetermined interval in a manner such that the bar lies in conformity with a time-signal point of time on the 24-hour time axis (H of the image screen of the manual data input device 29 with display and the lower end of the bar agrees with the current value of the graph display pointer P on the average power consumption axis (Q) as shown in FIG. 14 (Step c68), stores the value of the average power consumption QMkh in the graph pointer P cumulatively to update a display position of the next bar (Step c69) and further causes the register $\Sigma W$ for storage of the total power consumption in the interval to store the value of the integrated power consumption storage register $\Sigma WMkh$ cumulatively (Step c70).

Until the current value of the index k exceeds the total number n2 of motors, the CPU 18 for PC repeats the above processing in Steps c62 to c70 to display the bar of a length corresponding to the average power consumption QMkH of each motor in the interval between the precedent detection of time signal and the present detection of time signal so, for pile up the bars with the position of the graph pointer P as a starting point as shown in FIG. 14, for all the motors specified by the index k of 1 to n1, that is, the die height adjusting motor M6 and the nozzle touch motor M5. When the current value of the index k exceeds the total number n2 of motors, and it is thus ascertained by the decision processing in Step c63 that the display processing concerned with the motors is terminated, the CPU 18 for PC initializes the index k to zero again for starting the display processing concerned with various heaters (Step c71), increments a value of the index k by 1 (Step c72) and decides whether or not the value of the index k exceeds the total number n3 of heaters (Step c73).

When the value of the index k does not exceed the total number n3 of heaters, the CPU 18 for PC reads a current value of the integrated power consumption storage register $\Sigma WHk$ corresponding to the heater specified by a current value of the index k and a current value of a precedent integrated power consumption storage register $\Sigma WHkp$ corresponding to the heater specified by the current value of the index k (Step c74), finds substantially electric power $\Sigma WHkh$ consumed by the heater corresponding to the current value of the index k in the interval between the precedent detection of time signal and the present detection of time signal by subtracting the value of the precedent integrated power consumption storage register $\Sigma WHkp$ from the value of the integrated power consumption storage register $\Sigma WHk$ (Step c75) and replaces the value of the precedent integrated power consumption storage register $\Sigma WHkp$ with the current value of the integrated power consumption storage register $\Sigma WHk$ (Step c76).

Incidentally, the initial value of the precedent integrated power consumption storage register $\Sigma WHkp$ is zero as in the case of the integrated power consumption storage register $\Sigma WHk$, and the precedent integrated power consumption storage register $\Sigma WHkp$ is reset to the initial value in response to 0 A.M. time signal that is, at the end of a day by the processing in Step c86 which will be described later.

Subsequently, the CPU 18 for PC finds average power consumption QHkh of the heater corresponding to the current value of the index k in the interval between the precedent detection of time signal and the present detection of time signal by dividing the value of the substantially electric power $\Sigma WHkh$ consumed by the corresponding heater in the interval between the precedent detection of time signal and the present detection of time signal by the substantially total operating time Th of the injection molding machine in the interval between the precedent detection of time signal and the present detection of time signal to store the found value of the average power consumption QHkh in a file means for storage of the average power consumption in the interval for every power consuming element, in association with the presently detected time-signal point of time (Step c77).

The CPU 18 for PC displays a bar of a length corresponding to the average power consumption QHkh of the heater corresponding to the current value of the index k in the predetermined interval in a manner such that the bar lies in conformity with a time-signal point of time on the 24-hour time axis (H) of the image screen of the manual data input device 29 with display and the lower end of the bar agrees with the current position of the graph display pointer P on the average power consumption axis (Q) as shown in FIG. 14 (Step c78), stores the average power consumption QHkh in the graph display pointer P cumulatively to update the display position of the next bar (Step c79) and further causes the register ΣWHkh for storage of the total power consumption in the interval to store the value of the integrated power consumption storage register ΣWHk cumulatively (Step c80).

Until the current value of the index k exceeds the total number n3 of heaters, the CPU 18 for PC repeats the above processing in Steps c72 to c80 to display the bar of a length corresponding to the average power consumption QHkh of each heater in the interval between the precedent detection of time signal and the present detection of time signal so, for pile up the bars with the position of the graph display pointer P as a starting point, for the heaters specified by the index k of 1 to n3.

Incidentally, since the form of display by bar graphic representation in case of the heaters is exactly the same as that in case of the servo motors and the motors described above, displaying concerned with the heaters by bar graphic representation is omitted in FIG. 14.

When the current value of the index k exceeds the total number n3 of heaters, and it is thus ascertained by the decision processing in Step c73 that the display processing concerned with the heaters is terminated, the CPU 18 for PC finds the molding cycle count Ch in the interval by subtracting a value stored in a register Cp for storage of a count value (number of molding cycles) on the occasion of the precedent detection of time signal from a value of the counter C and stores the value of the counter C in the register Cp (Steps c81, c82). The CPU 18 for PC finds average power consumption Whc per molding cycle in the interval by dividing the value stored in the register ΣW for storage of the total power consumption in the interval by the molding cycle count Ch in the interval found in Step c81 to store the found average power consumption in the register and also displays the power consumption Whc per molding cycle in association with the bar representation of the average power consumption as shown in FIG. 14 (Step c83). Subsequently, the CPU 18 for PC adds the value of the register ΣW for storage of the total power consumption in the interval to the value be stored in the register ΣWd for integrating the daily total power consumption (Step c84). Incidentally, the register ΣWd is initialized to zero and is reset to zero at the end of a day, as will be described later.

Subsequently, the CPU 18 for PC finds a value of overall average power consumption up to the point of time by dividing the value of the register ΣWd for integrating the daily total power consumption by the value of the register ΣTc for integrating the daily total operating time; that is, finds a value AVE of the average power consumption resulting from dividing the total sum of power consumption of all of the injection servo motor M1, the clamping servo motor M3, the ejection servo motor M4, the screw rotating servo motor M2, the die height adjusting motor M6, the nozzle touch motor M5 and the heaters by the substantially operating time of the injection molding machine (Step c85) and displays a straight line AVE corresponding to the value AVE on the image screen of the manual data input device 29 with display as shown in FIG. 14 to give a value of the daily overall average power consumption up to this point of time (Step c86).

Subsequently, the CPU 18 for PC decides whether or not the date updating flag is set (Step c87). In the absence of the date updating flag, the CPU 18 for PC resets the time signal flag to end the processing for sequential control and display of power consumption for one molding cycle (Step c93) and returns to the processing in Step c1 to start the processing for the next molding cycle.

In other words, when updating of date is not detected every lapse of a predetermined interval such as two hours, for instance, each of the bars M1, M3, M4, M2, M6 and M5 or the like corresponding to the average power consumption which has been stored as the average power consumption of each power consuming element in the file means at every time-signal point of time during the interval, the total sum of the average power consumption of all the power consuming elements as indicated at every time-signal point of time by a bar M1+M3+M4+M2+M6+M5 formed by a pile of the bars and the power consumption Wh per molding cycle during the interval are displayed by the processing in Step c46, and further, each of the bars M1, M3, M4, M2, M6 and M5 or the like corresponding to the average power consumption of power consuming elements such as the servo motors, the motors and the heaters during the interval between the precedent detection of time signal and the present detection of time signal, the total sum of the average power consumption of all the power consuming elements during the interval between the precedent detection of time signal and the present detection of time signal as indicated by a bar M1+M3+M4+M2+M6+M5 formed by a pile of the bars and the power consumption Whc per molding cycle during the interval are displayed repeatedly in the state as shown in FIG. 14 by the processing in Steps c58, c68, c78 and c83.

For instance, when it is assumed that the processing in Step c46 is started in response to 4 P.M. time signal, reference to the file means for storage of the average power consumption in the interval in association with the time-signal point of time is first made by the processing in Step c46, all the average power consumption data up to the point of the precedent detection of time signal, that is, values of the average power consumption in the interval between 0 A.M. and 2 A.M. such as values stored as the values of the average power consumption of the servo motors M1, M3, M4 and M2, the motors M6 and M5 and the heaters (not shown) in association with 2 A.M. of time-signal point of time are displayed in the form of a pile of individual bars at a position representing the point of 2 A.M. in FIG. 14, the total sum of the average power consumption of all the power consuming elements is further displayed graphically in the form of a single bar composed of a pile of the individual bars at a position representing the point of 2 A.M., and the power consumption Whc per molding cycle is displayed. In the subsequent processing, data in the interval between 2 A.M. to 4 A.M., data in the interval between 4 A.M. and 6 A.M., . . . and data in the interval between 0 P.M. and 2 P.M. are read out, as in the above case, with reference to the file means for storage of the average power consumption in the interval in association with the time-signal point of time and are then displayed at positions representing the points of 4 A.M., 6 A.M., . . . , 2 P.M. as shown in FIG. 14, and then, data in the interval between 2 P.M. and 4 P.M. is newly calculated and displayed in association with the time-signal point of time at a position representing the point of 4 P.M. as shown in FIG. 14 by the processing in Steps c47 to c83.

With the above processing, the number of bars graphically displayed is increased one by one in a time-axis direction every lapse of the predetermined interval such as two hours. However, since the file means for storage of the average power consumption in the interval in association with the time-signal point of time is finally reset by the processing in Step c92 performed in response to 0 A.M. time signal the maximum number of bars graphically displayed is 12 in the case where the interval is set to 2 hours.

Since the value of the average power consumption AVE displayed by the processing in Steps c85 and c86 is calculated on the basis of the value of the register ΣWd for integrating the daily total power consumption with 0 A.M. set as the starting point and the value of the register ΣTc for integrating the daily total operating time with 0 A.M. set as the starting point, the average power consumption in the case of starting the processing in Step c46 in response to 2 P.M. time signal, for instance, is given as a value resulting from dividing the total power consumption in the interval between 0 A.M. and 2 P.M. by the total operating time in the interval between 0 A.M. and 2 P.M., while the average power consumption in the case of starting the processing in Step c46 in response to 4 P.M. time signal is given as a value resulting from dividing the total power consumption in the interval between 0 A.M. and 4 P.M. by the total operating time in the interval between 0 A.M. and 4 P.M. Thus, since the value of the average power consumption varies every interval it is necessary to recalculate the value of the average power consumption for redisplay every time the time signal is detected.

Further, when modifications are made on the molding conditions in the course of the daily operation, it is possible to easily observe how the modifications exert an influence upon the power consumption of each of the power consuming elements M1, M3, M4, M2, M6 and M5 or the like, and further how the modifications exert an influence upon the overall power consumption.

Furthermore, when the values of the average power consumption of the individual power consuming elements M1, M3, M4, M2, M6 and M5 or the like are compared with each other in a horizontal direction and also in a time-axis direction, it is possible to recognize the transition of the average power consumption in terms of time for each power consuming element.

The power consumption Whc per molding cycle makes it possible to recognize the transition of power consumption per molding cycle and per molded product.

On the other hand, when it is ascertained by the decision processing in Step c87 that the date updating flag is set, this decision processing is considered to be the first decision processing since the updating of date, and therefore, the CPU 18 for PC proceeds with the processing from Step c88 onward to start the processing to display the integrated power consumption of all the power consuming elements together with daily average power consumption Wdc per molding cycle on the display screen as shown in FIG. 15.

The CPU 18 for PC first finds the daily average power consumption Wdc per molding cycle by dividing a value of a register Wd for integrating the daily total power consumption by the value of the counter C to store the found value in the register (Step c88) and adds the value of the counter C to a value of a counter ΣCe for integrating the total shot count (Step c89). Then, the CPU 18 for PC displays, with reference to the file means for storage of the cumulatively total power consumption in association with the shot count C, data of all the cumulatively total power consumption which have been stored in the file means up to the point of the precedent updating of date and data of the daily power consumption Wdc per molding cycle in the manual data input device 29 with display by bar graphic representation in association with the past shot count as shown in FIG. 15, then adds the value of the daily total power consumption storage register ΣWd to a value of a cumulatively total power consumption storage register ΣWe to update the value of the cumulatively total power consumption storage register ΣWe and causes the file means to store the updated value in association with the shot count C (Step c90).

Subsequently, the CPU 18 for PC displays a current value of the cumulatively total power consumption storage register ΣWe updated by the processing in Step c90 on the manual data input device 29 with display by bar graphic representation in association with a current value of the total shot counter ΣCe, forday's daily new data concerned with the cumulatively total power consumption and the number of shots as shown in FIG. 15 (Step c91), then initializes the various kinds of registers applied to the daily data processing, that is, the total operating time storage register ΣTc, the precedent total operating time integrating register ΣTcp, the counter C, the register Cp for storage of the value of the counter C on the occasion of the precedent detection of time signal, the register ΣWd for integrating the daily total power consumption, the integrated power consumption storage registers ΣWS1 to ΣWSn1, the integrated power consumption storage registers ΣWM1 to ΣWMn2, the integrated power consumption storage registers ΣWH1 to ΣWHn3, the precedent integrated power consumption storage registers ΣWS1p to ΣWSn1p, the precedent integrated power consumption storage registers ΣWM1p to ΣWMn2p, the precedent integrated power consumption storage registers ΣWH1p to ΣWHn3p, the maximum value storage registers QS1(max) to QSn1(max), the maximum value storage registers QM1(max) to QMn2(max) and the maximum value storage registers QH1(max) to QHn3(max) to zeros, then sets the minimum value storage registers QS1(min) to QSn1(min), the minimum value storage registers QM1(min) to QMn2(min) and the minimum value storage registers QH1(min) to QHn3(min) again at their applicable maximum values (Step c86), resets the time signal flag and the date updating flag (Step c87) and returns to the processing in Step c1 to start the processing for the next molding cycle.

In other words, all the data of the cumulatively total power consumption which have been stored in the file means up to the precedent day is read and displayed on the manual data input device 29 with display in association with the shot count by the processing in Step c90 (all the bars ranging from the left end bar to the sixth bar in the example shown in FIG. 15), and further, the cumulatively total power consumption up to the present day is newly calculated and then additionally displayed on the manual data input device 29 with display by the processing in Step c91 (the right end bar in the embodiment shown in FIG. 15).

It is a matter of course that an injection molding operation is not necessarily performed continuously up to 0 A.M. However, since the date updating flag is automatically set in the controller 10 whenever it is past 0 A.M. by processing at the side of the timer device even when the injection molding operation is completed earlier than 0 A.M., and the set state of the date updating flag is held over until the following day, the processing at Step c83 and following Steps concerned with the display of the cumulatively total power consumption is automatically started in response to the first time signal detected in the course of an injection molding operation performed on the following day.

Since it is possible to recognize the relation between the power consumption and the number of products with reference to the display screen as shown in FIG. 15, the manufacture cost (power cost) of products may be easily calculated.

According to the present invention, when the modification is made on any molding condition, the power consumption for the modified condition can be obtained as described above, and besides, the power consumption before and after modification on the molding condition is displayed in time series as shown in FIG. 14 so that it is possible to select the molding conditions which requires less power consumption. Thus, when a molding condition is modified, then processing at Step c92 is performed, in other words, the counters and the registers are set to their initial states and processing at Step c1 and following Steps are performed. Since the power consumption after such modification on a molding condition is displayed in such manner as is shown in FIG. 13 or 14, the optimum molding conditions can be selected with reference to the screen displaying the states before and after modification on a molding conditions (See FIG. 14 in particular).

In the foregoing, a description has been given of the embodiment in case of the electromotive injection molding machine which carries out repeatedly sequential operation including mold closing, injection, pressure holding, measuring, mold opening and ejection as a series of operating processes. However, it is to be understood that the various kinds of display on the display screen as shown in FIGS. 13 to 15 may be applied to other kinds of machines which operates with a specific timing, in other words, machines effective in machining and handling mass products by repeating the same machining program and the same operation program or the like, such as machine tools, industrial robots and press machines inclusive of wire electric discharge machines.

Instead of the display of power consumption as described in the above embodiment, the power consumption may be printed, stored in, a storage medium or outputted to a communication line so that a host computer can receive that information or the like for management. In this case, the display processing in steps c22, c23, c44, c58, c68, c77, c83, c90 and c91 or the like is replaced with print processing, processing to store in a storage medium or processing to output to a communication line.

What is claimed is:

1. A power consumption display device for a machine which includes power consuming elements concerned with drive or control and carries out a same operation repeatedly, comprising:

a detection unit detecting power consumption of said power consuming elements in a cycle of repetitive operation; and a permitting unit permitting an integrated value of the power consumption per cycle of the repetitive operations of said power consuming elements of said machine, detected by said detection unit, to be displayed, printed, stored in a recording medium or outputted to a communication line.

2. A power consumption display device for a machine which includes power consuming elements concerned with drive or control and carries out a same operation repeatedly, comprising:

a detection unit detecting power consumption of said power consuming elements every predetermined time period; and a permitting unit permitting a total sum of an integral value of the power consumption per cycle of repetitive operations of said power consuming elements, detected by said detection unit, to be displayed, printed, stored in a recording medium or outputted to a communication line every predetermined time period.

3. A power consumption display device for a machine which includes power consuming elements concerned with drive or control and carries out the same operation repeatedly, comprising:

a detection unit detecting power consumption and the number of repetitive operation cycles of said machine every predetermined time period; and a permitting unit permitting an integrated value of the power consumption per cycle of repetitive operations of said machine and the number of repetitive operation cycles, detected by said detection unit every predetermined time period, to be displayed, printed, stored in a recording medium or outputted to a communication line.

4. A power consumption display device for a machine which includes power consuming elements concerned with drive or control and carried out the same operation repeatedly, comprising:

a detection unit detecting power consumption and the number of repetitive operation cycles of said power consuming elements every predetermined time period;

a permitting unit permitting a total sum of an integrated value of the power consumption per cycle of repetitive operations of said power consuming elements and the number of repetitive operation cycles, detected by said detection unit every predetermined time period, to be displayed, printed, stored in a recording medium or outputted to a communication line.

5. A power consumption display device for a machine according to claim 1, wherein said power consumption is displayed or printed in time series by numeric or graphic representation.

6. A power consumption display device for a machine according to claim 1, wherein a power measuring unit is installed to each power consuming element to perform measurement of the power consumption.

7. A power consumption display device for a machine according to claim 1, wherein the power consumption is calculated by detecting drive current of an amplifier for driving said power consuming elements.

8. A method for storing power consumption data for a machine, comprising:

detecting power consumption of power consuming elements of the machine in a cycle of repetitive operation;

calculating an integrated value of power consumption of the power consuming elements over the cycle; and storing the calculated integrated value of power consumption of said power consuming elements of the machine within each cycle, on a computer readable storage.

9. A method as recited in claim 8, further comprising displaying the stored power consumption by numeric or graphic representation.

10. A method as recited in claim 8, wherein the power consumption is calculated by detecting drive current of an amplifier for driving the power consuming elements.

* * * * *

UNITED STATES PATENT AND TRADEMARK OFFICE
CERTIFICATE OF CORRECTION

PATENT NO.    : 6,526,360 B1
DATED         : February 25, 2003
INVENTOR(S)   : Susumu Ito et al.

It is certified that error appears in the above-identified patent and that said Letters Patent is hereby corrected as shown below:

Column 3,
Line 62, after "control" insert -- , --.

Column 4,
Line 59, after "control" insert -- , --.

Column 10,
Line 44, after "signal" insert -- , --.

Column 11,
Line 13, change "CMk" to -- CHk --;
Line 41, change "Qk" to -- QHk --; and
Line 42, after "signal" insert -- , --.

Column 12,
Line 49, after "signal" insert -- , --.

Column 13,
Line 34, change "The" to -- Th --.

Column 15,
Line 59, change "(H" to -- (H) --.

Column 16,
Line 12, begin new paragraph with "When".

Column 19,
Line 23, after "interval" insert -- , --.

Signed and Sealed this

Seventeenth Day of June, 2003

JAMES E. ROGAN
*Director of the United States Patent and Trademark Office*